United States Patent
Danioni (10) Patent No.: US 8,633,770 B2
(45) Date of Patent: Jan. 21, 2014

(54) CURRENT SENSE AMPLIFIER HAVING BIPOLAR COMMON MODE INPUT RANGE

(75) Inventor: Alberto Danioni, Pavia (IT)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/305,466

(22) Filed: Nov. 28, 2011

(65) Prior Publication Data

US 2013/0135047 A1  May 30, 2013

(51) Int. Cl.
*H03F 3/45* (2006.01)

(52) U.S. Cl.
USPC .......................................... 330/252; 330/261

(58) Field of Classification Search
USPC .................................. 330/252, 253, 257, 261
See application file for complete search history.

(56) References Cited

U.S. PATENT DOCUMENTS

| 5,966,046 | A  | * | 10/1999 | Bezzam et al. | 330/252 |
| 6,028,479 | A  | * | 2/2000  | Babanezhad    | 330/253 |
| 6,529,078 | B1 | * | 3/2003  | Gosser et al. | 330/255 |
| 6,636,116 | B2 | * | 10/2003 | Cameron       | 330/260 |
| 7,215,198 | B1 | * | 5/2007  | Dasgupta      | 330/256 |
| 7,479,831 | B2 | * | 1/2009  | Malone        | 330/257 |

* cited by examiner

*Primary Examiner* — Khanh V Nguyen
(74) *Attorney, Agent, or Firm* — Andrew Viger; Wade J. Brady, III; Frederick J. Tekecky, Jr.

(57) ABSTRACT

An amplifier configuration including first and second amplifier inputs and a bias input adapted to receive a common mode signal indicative of a common mode input voltage. First and second amplifier input stage sections, each having first and second inputs coupled to respective ones of the first and second amplifier inputs, are provided. Operating mode circuitry switches the amplifier configuration between first and second operating modes in response to the common mode signal, where in the first operating mode the first and second amplifier input stage sections are active and inactive, respectfully and where in the second operating mode the first and second amplifier input stage sections are inactive and active, respectfully. The active first and second amplifier input stage sections are capable of operating with common mode voltages in excess of the upper and lower power supply rails, respectively.

18 Claims, 6 Drawing Sheets

CURRENT SENSE AMPLIFIER HAVING BIPOLAR COMMON MODE INPUT RANGE

BACKGROUND OF THE INVENTION

1. Field of the Invention

The present invention relates generally to amplifiers and in particular to amplifier configurations capable of amplifying differential signals having associated common mode input voltages which exceed both the upper and lower power supply rails

2. Description of Related Art

Figure 1A:
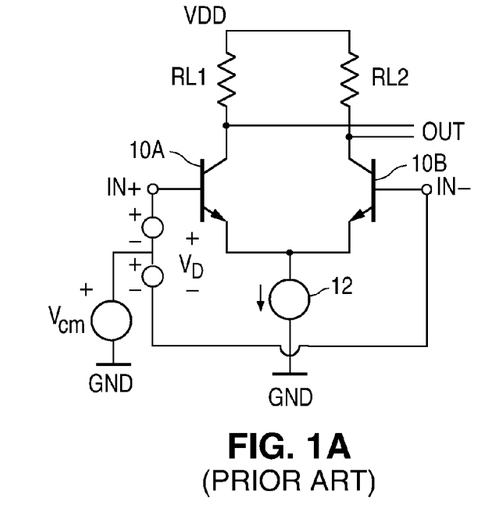
FIGS. 1A-1C show various prior art amplifier input stages which are capable of operating with common mode input voltages near either or both power supply rails.

Referring to the drawings, FIG. 1A is a simplified diagram of a common type of input stage of a differential amplifier. The input stage includes a pair of NPN transistors 10A/10B having their respective emitters connected to a common tail current source 12. A pair of load resistors RL1 and RL2 are connected intermediate the respective collector electrodes of the transistors and the upper supply rail Vdd. The input to the amplifier stage is a differential signal Vd, applied between the base electrodes of the transistors, and an associated common mode signal Vcm. The amplifier ideally amplifies the differential signal Vd and does not respond to the common mode signal Vcm. For proper operation, the common mode signal Vcm typically must remain at a voltage level intermediate the upper and lower power supply rails which, in this example, are Vdd and Gnd respectively. The differential signal Vd is not an issue since external feedback (not depicted) forces the voltage between the inputs to be relatively small.

The FIG. 1A common mode input Vcm can be increased up to, and slightly past, the upper supply rail Vdd and the stage will continue to operate. However, the common mode voltage Vcm must be sufficiently large so that the transistor that forms current source 12 does not saturate (collector-base junction forward biased), with that voltage typically being around +0.9 V. Thus, should the common mode voltage Vcm drop below +0.9 V, the input stage will no longer operate properly.

Figure 1B:
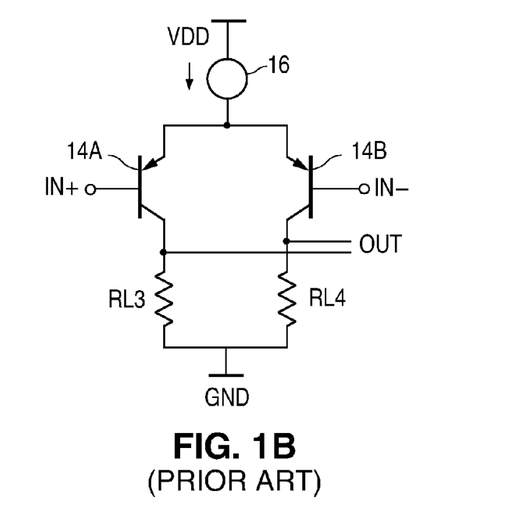

FIG. 1B shows another exemplary differential input stage which utilizes PNP transistors 14A/14B having their respective emitters connected to a common current source 16 (inputs Vd and Vcm not depicted). Load transistors RL3 and RL4 are connected between the respective collectors and the lower supply rail Gnd. In this configuration, the common mode input voltage Vcm can drop all the way to Gnd and slightly below. However, the common mode voltage Vcm must not exceed a value equal to Vdd less 0.9 V in order to insure that the current source 16 transistor does not saturate.

Figure 1C:
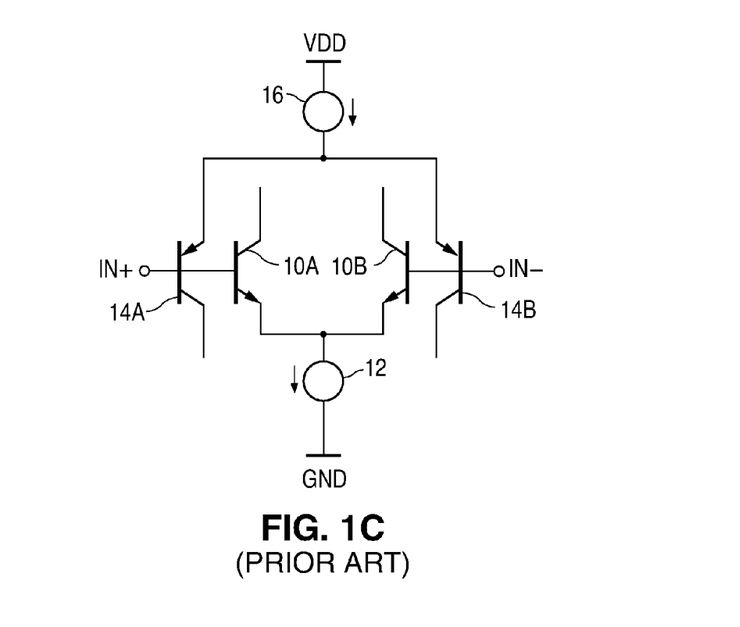

In order to maximize the common mode voltage operating range, it is possible to combine the features of the FIG. 1A/1B input stages, as shown in FIG. 1C. Two differential transistor pairs are used, including PNP pair 14A/14B and NPN pair 10A/10B. The PNP pair 14A/14B have emitters connected to a common current source 16 and the NPN pair 10A/10B have emitters connected to a common current source 12. The load circuitry for the two transistor pair is not depicted, but may be in the form of a folded cascode circuit.

Bias circuitry, also not depicted, operates so that the PNP pair 14A/14B are active when the common mode voltage Vcm is in a range from about Vdd/2 and Gnd and so that the NPN pair 10A/10B are active when the common mode voltage Vcm is in a range from about Vdd to Vdd/2. Preferably there is an overlap area near Vdd/2 when both pair are active. Thus, the common mode voltage range will extend from a value slightly greater than Vdd down a value slightly lower than Gnd.

Figure 2A:
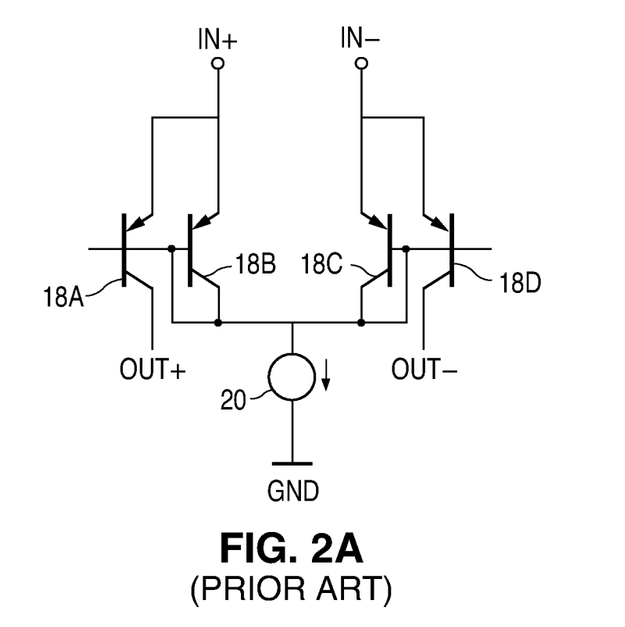
FIGS. 2A-2B show various prior art amplifier input stages which are capable of operating with common mode input voltages above or below the power supply rails.

FIG. 2A is a simplified diagram of a further differential amplifier input stage comprised of PNP transistors 18A, 18B, 18C and 18D connected in a common base configuration. As will be explained, this input stage configuration is capable of operating with common mode input voltages greater than the positive power supply rail voltage Vdd.

Transistors 18A and 18D form the input differential transistor pair, with diode-connected transistors 18B and 18C functioning to determine the input transistor current biasing level. The total current is set by a current source 20 which is split equally between the two halves of the input stage. The emitter area ratio of transistors 18A/18B (or 18D/18C) sets the bias current and consequently the transconductance gain of the transistors. The outputs Out+ and Out− can go to a folded cascode stage (not depicted). In this configuration, if the base-collector junctions of transistors 18A and 18D and the circuitry implementing current source 20 can sustain high voltages, the two inputs In+ and In− can be pulled up beyond the positive supply rail, with the limit being set by the break down voltage of these base-collector junctions and current source transistors.

Figure 2B:
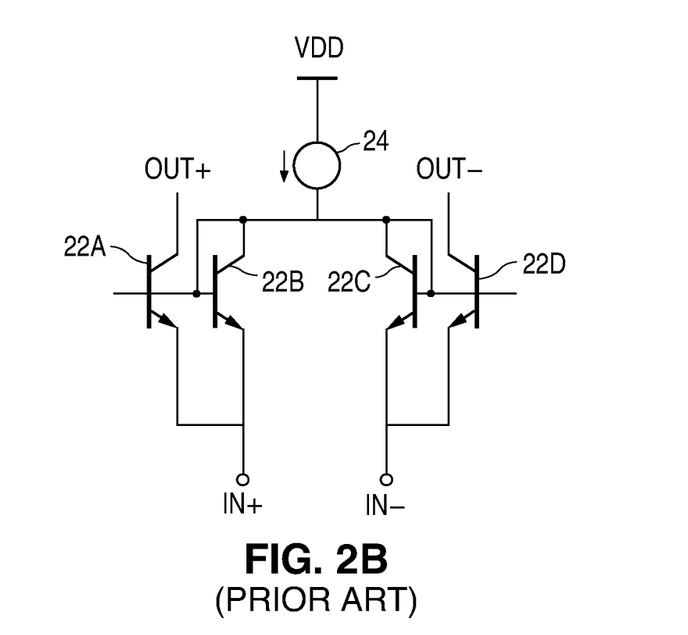

FIG. 2B is a simplifier diagram of another input stage capable of operating with common mode input voltages down to and slightly less than the negative supply rail Vdd. This input stage, which is the complement of the FIG. 2A input stage, includes four common base configured NPN transistors 22A, 22B, 22C and 22D. Once again, the diode-connected transistors 22B and 22C function to provide biasing to the input transistor pair 22A and 22D. The outputs Out+ and Out− can be coupled to a folded cascode stage (not depicted). One common approach to provide high voltage capability in epitaxial processes is to fabricate each device (bipolar, MOS transistors and DMOS transistors) in a separate epitaxial pocket (N type growth on a P type substrate). In order to isolate the pockets and sustain high voltages, the pockets are surrounded by P type rings connected to the P type wafer substrate. As a result, the collectors on NPN transistors 22A and 22B located in the isolated pockets cannot be brought below ground level Vdd since doing so would forward bias the PN junction formed by the N type collector and the P type isolation ring connected to the substrate. Thus, the inputs In+ and In− can only go down to the circuit common Vdd and a few millivolts below, otherwise the collector/isolation PN junction will be forward biased.

Figure 3:
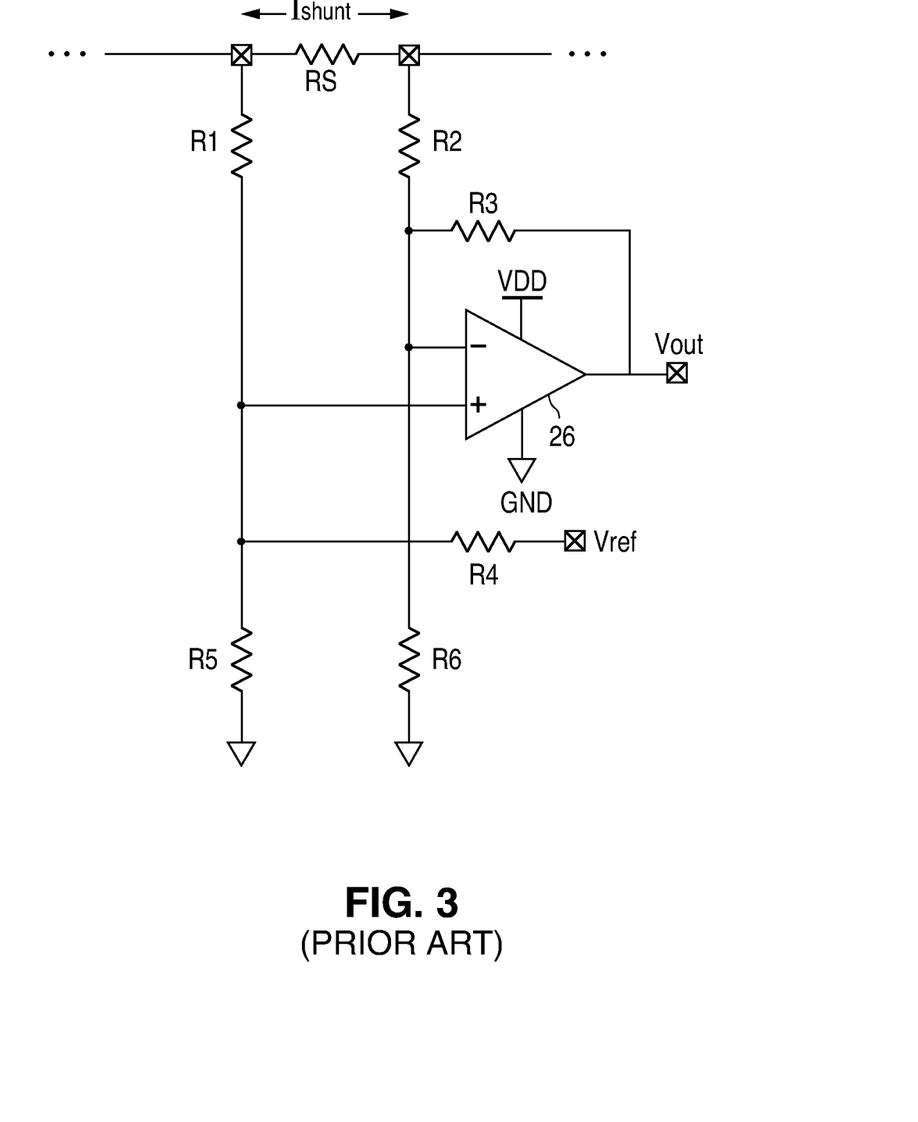
FIG. 3 is a prior art current sense amplifier configuration which includes external resistors that perform a level shifting function so that high common mode input voltages are level shifted to values intermediate the power supply rails.

Current sense amplifiers have input stages that are frequently required to operate over a wide range of common mode inputs. Current sense amplifiers are typically used to amplify small differential signals across a shunt resistor in which a current to be measured flows. FIG. 3 shows an exemplary prior art current sensing circuitry which includes, among other things, a current sense amplifier 26 and a shunt resistor Rs through which a current to be measured, Ishunt, flows. In many applications, the small signal developed across Rs can have a much larger common mode component. By way of example, in many battery operated systems such as laptop computers and power tools, it is necessary to measure current flow from the battery into the associated load. In a common configuration, the battery voltage can be much larger that the voltage of the power supply associated with the analog/digital circuitry in the system, including the current sense amplifier 26. Thus, a battery may be made up several cells arranged in a stack configuration so as to generate +15 volts. Depending upon the location of the shunt resistor Rs relative to the load and battery, the common mode voltage at the shunt resistor terminals may be close to the battery voltage of +15 V. The current sense amplifier 26 and other analog/digital circuitry are typically powered by a much lower voltage Vdd such as +5 V, +3.6 V or +1.8 V produced by a voltage regulator powered by the battery. In that case, the high common mode voltage of +15V would not be compatible with current amplifier 26 if applied directly to the amplifier inputs since amplifier circuitry would not normally function with input voltages that are outside the power supply voltage Vdd and ground (Gnd). In addition, such a high voltage could damage the amplifier 26 input circuitry.

Another prior art approach to addressing this common mode voltage problem associated with current sense amplifiers is also shown in FIG. 3. A level shift circuit in the form of a resistor bridge, made up of resistors R1, R2, R5 and R6, is used to isolate the high common mode voltages which may be present at shunt resistor Rs. The voltage Vref connected to resistor R4 is typically the circuit common (Gnd) or one-half the supply voltage Vdd. The goal is to maintain the input voltages of amplifier 26 between the power supply rails which are Vdd and ground (Gnd) in this example. Typically, resistors R1 and R2 are of equal values as are resistors R3 and R4 and resistors R5 and R6. The magnitude of the level shift or attenuation factor is approximately set by the resistance ratio of R1/R5 (or R2/R6). Thus, assuming that the common mode voltage at shunt resistor Rs is +15 V and assuming that the amplifier 26 supply voltage Vdd is +5, the resistance ratio should be around 7.5 so that the common mode voltage is shifted down to one-half the supply voltage Vdd, that is, down to +2.5 V.

Assuming that a 5V process is used to fabricate the FIG. 3 circuitry, there is an initial constraint that the resistors should be realized with poly or thin-film since this approach does not require any high voltages to be applied to any junction towards the substrate of the die. Generally the FIG. 3 approach is an effective way to protect amplifier 26 which is usually a circuit fabricated using high-precision, low voltage processes. However, an analysis of the level shifting approach of FIG. 3 reveals at least three serious shortcomings. First, the input offset voltage of amplifier 26 is amplified directly in proportion to the attenuation factor. Second, the amplifier input noise is amplified directly in proportion to the attenuation factor. Third, the −3 dB bandwidth of the amplifier is reduced in direct proportion to the attenuation factor.

A further solution to increasing the common mode input range of an amplifier is based upon the use of various high voltage processes known in the semiconductor industry. However, these processes provide only a moderate integration density which places a severe trade-off between circuit complexity (i.e., functionalities like digital output, multiple gain configurability, fault detection and the like). As a result of this and other factors, it is believed that the majority of current sense amplifiers used in high performance battery operated systems utilize low-voltage, high density processes.

There is a need for amplifier circuitry having a wide common mode input range without sacrificing input offset, bandwidth and noise performance. As will become apparent to those skilled in the art after reading the following Detailed Description of the Invention together with the drawings, the present invention addresses these needs.

DETAILED DESCRIPTION OF THE INVENTION

Figure 4:
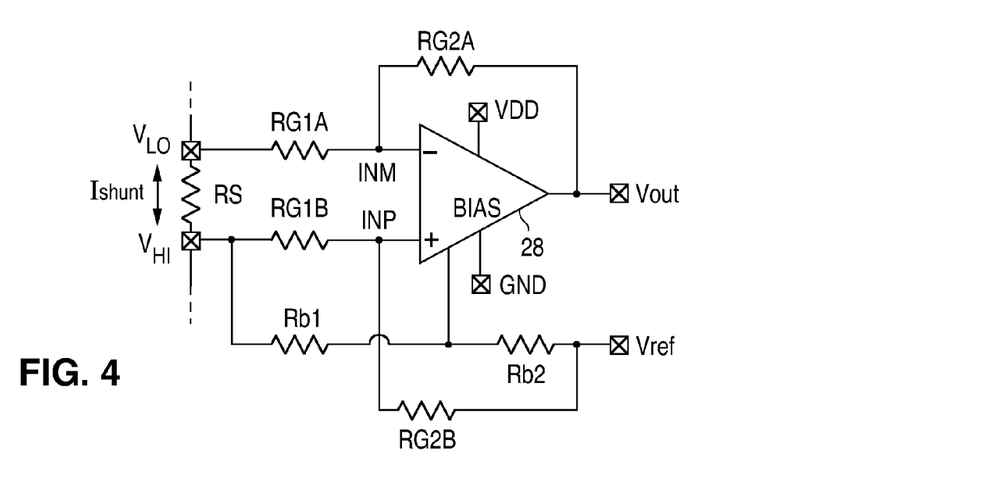
FIG. 4 is a current sense amplifier configuration in accordance with one aspect of the present invention.
Figure 5:
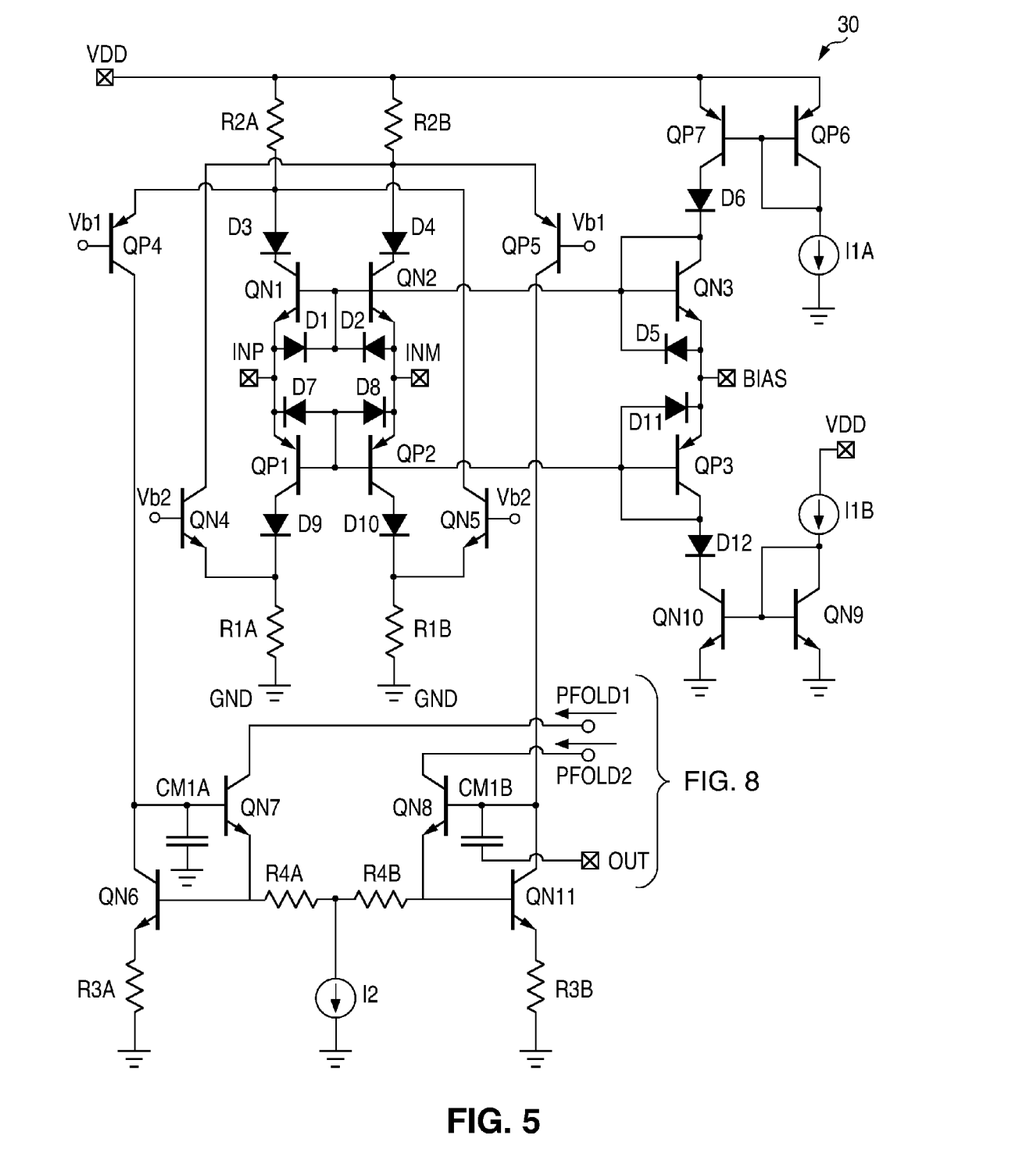
FIG. 5 is a schematic diagram of the input stages followed by a second amplifier stage of a current amplifier in accordance with another aspect of the present invention for use in the current sense amplifier of FIG. 4.
Figure 8:
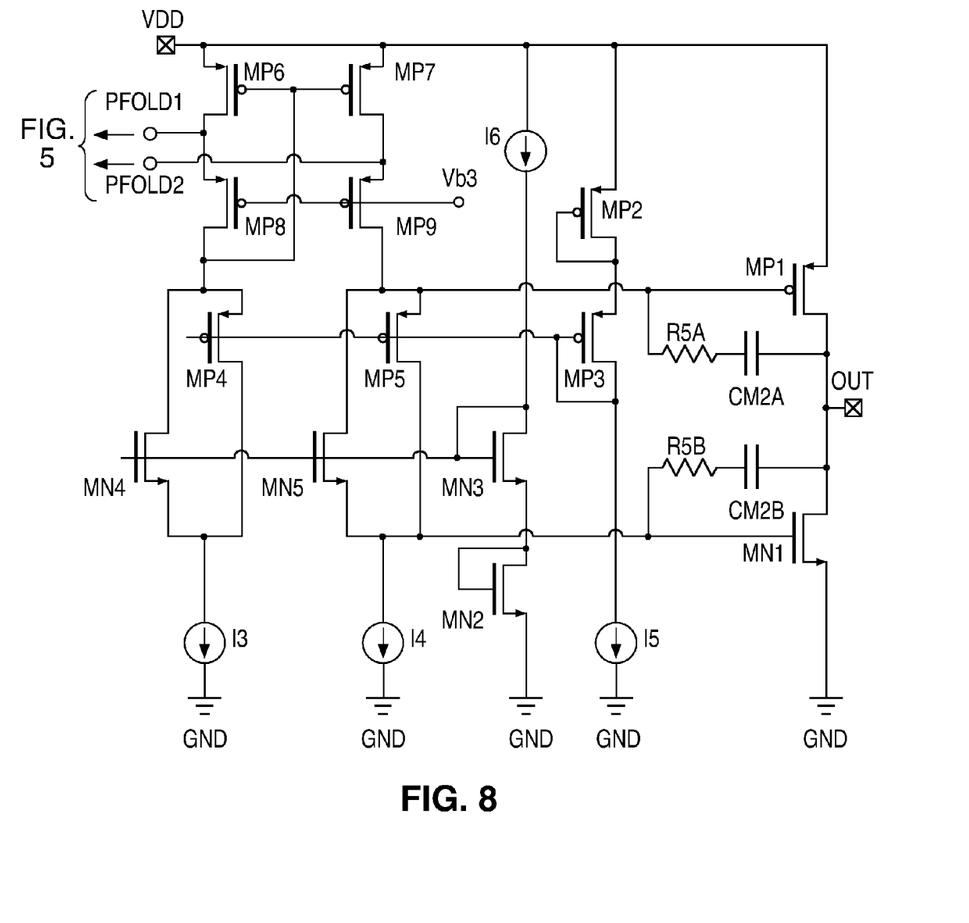
FIG. 8 is schematic diagram of the output stage for use in the current sense amplifier of FIG. 4.

Referring again to the drawings, FIG. 4 shows a circuit topology in accordance with one aspect of the present invention, including a current sense amplifier 28 and associated external resistor components. FIG. 5 is a schematic diagram of the input stages and second stage of amplifier 28, with FIG. 8 showing a schematic diagram of the output stage. The exemplary circuit is suitable for use in a typical current sensing application where the current amplifier 28 is powered by a supply voltage Vdd ranging from +3.3V to +5V. The amplifier configuration has the ability to safely sense a current signal having a common mode voltage swing with an absolute value higher than the supply voltage Vdd (+12 V for example) or lower than the circuit common Gnd (−12 V for example).

The circuit topology includes input resistors RG1A and RG1B having respective outer terminals connected to the opposite terminals of the current shunt resistor Rs, namely nodes $V_{LO}$ and $V_{HI}$. The inner terminals of resistors RG1A and RG1B are connected, respectively, to the inverting input INM and non-inverting input INP of the current amplifier 28. A feedback resistor RG2A is connected between the amplifier output and the inverting input INM. Another resistor RG2B is connected between the non-inverting input INP and a Vref node, with the Vref node being connected either to the circuit ground Gnd or to a voltage equal to Vdd/2 as will be explained. A pair of resistors Rb1 and Rb2 form a voltage divider, with Rb1 being connected between input node $V_{HI}$ and an internal bias node, referred to as the Bias node, of the current amplifier 28. Resistor Rb2 of the divider is connected between the Bias node and the Vref node.

The input differential signal produced across the shunt resistor Rs is present between nodes $V_{LO}$ and $V_{HI}$. In the event the current to be sensed flows in one direction, the current enters the shunt resistor Rs at $V_{HI}$. In the event signal Vref is connected to circuit common Gnd, the amplifier implements a mono-direction current sense amplification of the voltage $V_{HI}-V_{LO}$ referenced to ground. If signal Vref is connected to one-half of the supply voltage (Vdd/2), the amplifier implements a bi-directional current sense amplification of the voltage $\pm|(V_{HI}-V_{LO})/2|$. Assuming that the resistances of RG1A=RG1B=Rb1 and the resistances of RG2A=RG2B=Rb2, the voltage gain G of the circuit in both configurations is G=RG2/RG1.

Note that the objective of selecting the resistor values RG2 and RG1 is to set the gain G of the current amplifier and not to provide a common mode attenuation function as in the case of the prior art FIG. 3 topology. As will be described, the voltage divider formed by resistors Rb1 and Rb2 causes the internal bias voltages of the amplifier 28 input stages to change with the common mode input voltage.

Referring to the current amplifier 28 diagram of FIG. 5, there are two pair of amplifier input transistors. One pair includes NPN type transistors QN1 and QN2 which are arranged in a common base configuration, with the amplifier input INP being connected to the emitter of QN1 and amplifier input INM being connected to the emitter of QN2. The collector electrode of transistor QN1 is connected to a series combination of a diode D3 and resistor R2A connected to supply Vdd which function as part of the load. Similarly, the collector electrode of transistor QN2 is connected to a series combination of a diode D4 and resistor R2B to supply Vdd which function as part of the load. Note that all of the diodes are diode-connected transistors where the diode is formed from the collector-base junctions having a relatively high breakdown voltage.

The second input transistor pair includes PNP type transistors QP1 and QP2 which are also arranged in a common base configuration. The amplifier input INP is connected to the emitter of transistor QP1 and the amplifier input INM is connected to the emitter of transistor QP2. The collector electrode of transistor QP1 is connected to the circuit common Gnd by a series combination of resistor R1A and diode D9 which function as part of the load. Similarly, the collector electrode of transistor QP2 is connected by a series combination of a diode D10 and resistor R1B connected to Gnd, with these components functioning as part of the load.

The common base electrodes of transistors QN1 and QN2 are connected to a biasing circuit arrangement 30 (sometimes referred to as the operating mode circuitry) which includes a diode-connected NPN transistor QN3. A reference current source I1A produces a reference current which is reflected in NPN transistor QN3 by a current mirror circuit comprising transistors QP6 and QP7. A biasing voltage at the collector-base terminal of transistor QN3 is provided to the common bases of transistors QN1 and QN2. As will be explained, this biasing voltage is related to a common mode signal present at the Bias node. The biasing circuit arrangement 30 also produces a biasing voltage at the base-emitter terminals of diode-connected PNP transistor QP3. This biasing voltage, which is also related to the common mode signal, is provided to the common base connection of transistors QP1 and QP2. A second reference current source I1B produces a reference current equal to the current produced by source I1A. The current from source I1B is reflected in transistor QP3 by a current mirror circuit comprising transistors QN9 and QN10.

As can be seen in FIG. 4, resistors Rb1 and Rb2 form a voltage divider, with the Bias node at the junction of the two resistors being at a voltage intermediate the common mode input voltage, which is closely approximated by the voltage at $V_{HI}$ on the outer terminal of resistor Rb1 and voltage Vref present on the outer terminal of resistor Rb2. The base-emitter voltages of transistors made in the same process and operating at the same temperature (i.e., near one another on a common die) will be equal to one another if the transistors are operating at the same current density defined by $I_Q/A_Q$ where $I_Q$ is the emitter current and $A_Q$ is the emitter region area. Thus, assuming that all of transistors QN1, QN2 and QN3 (FIG. 5) are operating in the active region and assuming that the base-emitter voltages are maintained near the same value, i.e., inputs INP and INM and the Bias node are at substantially the same voltage, the three transistors will be operating at the same current density determined by the emitter area of transistor QN3 and the magnitude of the current $I_{QN3}$ in transistor QN3. That magnitude is determined by the relative emitter areas of current mirror transistors QP6/QP7 and the current from source I1A. The amplifier input transistors QN1 and QN2 will usually be identical so that the equal emitter area devices will have equal quiescent currents when the differential input is zero.

Similarly, assuming that all of transistors QP1, QP2 and QP3 (FIG. 5) are operating in the active region and assuming that the base-emitter voltages are maintained near the same value, i.e., inputs INP and INM and the Bias node are at substantially the same voltage, the three transistors will be operating at the same current density determined by the emitter area of transistor QP3 and the magnitude of the current provided by source I1B and the relative emitter areas of current mirror transistors QN9/QN10. The other amplifier input transistors QP1 and QP2 will usually be identical so that the equal emitter area devices will have equal quiescent currents.

A brief partial explanation of the operation of the input stage will be helpful at this point. This input stage has three modes of operation. In a first operating mode, the common mode input voltage is relatively high, with the input transistor pair QP1 and QP2 being active and input transistor pair QN1 and QN2 being inactive. In a second operating mode, the common mode input voltage is relatively low, with the input transistor pair QN1 and QN2 being active and transistor pair QP1 and QP2 being inactive. Finally there is a third operating mode where the common mode input voltage is at a relatively narrow midlevel and both transistor input pair are active.

Assume by way of example that the common mode input voltage present at nodes $V_{LO}$ and $V_{HI}$ (FIG. 4) is +12 V and that the amplifier 28 supply voltage Vdd is +3.3V. These conditions place the amplifier input stage in the first operating mode. Also assume, as will be explained, that the voltages at nodes INM, INP and Bias (respective voltages $V_{INM}$, $V_{INP}$ and $V_{BIAS}$) are the same and are well above the supply voltage Vdd of +3.3 V.

When a high common mode voltage is present, as in the present example, transistors QP1, QP2 and QP3 are correctly biased, with transistor QP3 conducting a current $I_{QP3}$ determined by current source I1B and the relative emitter areas of current mirror transistors QN9/QN10. As previously noted, all three transistors QP1, QP2 and QP3 operate at equal current densities provided the inputs INP and INM and the Bias node (respective voltages $V_{INM}$, $V_{INP}$ and $V_{BIAS}$) are maintained at the same voltage based upon the resistance values of the external resistors Rb1, Rb2, RG1B and RG2B, as will be described. Transistors QP1 and QP2 have equal emitter areas $A_{QP1}$ and $A_{QP2}$ and thus conduct equal currents $I_{QP1}$ and $I_{QP3}$. Quiescent currents $I_{QP2}$ and $I_{QP1}$ are determined by current $I_{QP3}$ as follows, assuming equal current densities:

$$I_{QP1}/A_{QP1}=I_{QP2}/A_{QP2}=I_{QP3}/A_{QP3} \tag{1}$$

or $$I_{QP1}=I_{QP2}=(A_{QP1}/A_{QP3})I_{QP3} \tag{2}$$

where $$A_{QP1}=A_{QP2}$$

In addition to transistors QP1, QP2 and QP3 being active in the first operating mode, diodes D9, D10 and D12 are forward biased. The high voltage produced by the high common mode input voltage is completely sustained by the collector-base junctions of transistors QP1, QP2 and Q10 which typically have a breakdown voltage of at least 20 volts even using conventional low voltage, high precision processes. Thus, no level shifting as illustrated in the FIG. 3 prior art circuit is required. In addition, transistors QN1, QN2 and QN3 are off and diodes D3, D4 and D6 are reversed biased. Diodes D1, D2 and D5 bring the bases of off transistors QN1, QN2 and QN3 to approximately the input common mode voltage so as to prevent the base-emitter junctions of those transistors from breaking down, with a typical base-emitter break down voltage being only around 6 volts.

Figure 7A:
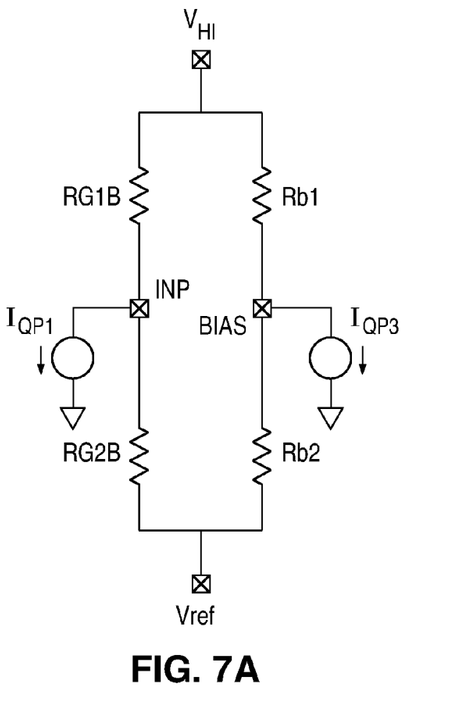
FIGS. 7A-7B are simplified diagrams which illustrate one approach for correctly biasing the input stages of the current sense amplifier of FIG. 4.

FIG. 7A is a circuit diagram illustrating the manner in which the input INP and the Bias node are maintained at the same voltage in the first operating mode. The diagram shows resistors Rb1, Rb2, RG1B and RG2B connected to the various circuit nodes, including the common mode input node at $V_{HI}$, the reference node Vref, the input node INP and the Bias node. For a high common mode input voltage (first operating mode), transistor QP3 (FIG. 5) conducts a current $I_{QP3}$. Since transistor QN3 is off in this mode, the net current at the Bias node is $I_{QP3}$ with this current being drawn from resistors Rb1/Rb2 into the Bias node. In addition, since transistor QN1 is off, and transistor QP1 is on, QP1 conducts a current $I_{QP1}$ which is drawn from resistors RG1B/RG2B into input node INP. In the simplified case where the emitter areas $A_{QP1}$ and $A_{QP3}$ are equal, the two currents $I_{QP1}$ and $I_{QP3}$ are equal so that nodes INP and Bias are maintained at the same voltage by setting RG1B and Rb1 to equal values and by setting RG2B and Rb2 to equal values. If the areas are not the same, the two currents, which are inversely related to the emitter areas, will not be the same. An inspection of the FIG. 7A diagram shows that, assuming the input INP and Bias nodes are at the same voltage, the following is true:

$$Rb1(I_{QP3}) = RG1B(I_{QP1}) \quad (3)$$

Substituting for $I_{QP1}$ using equation (2), the following results:

$$Rb1(I_{QP3}) = RG1B(A_{QP1}/A_{QP3})I_{QP3} \quad (4)$$

or $$Rb1 = (A_{QP1}/A_{QP3})RG1B \quad (5)$$

An inspection of the FIG. 7A diagram also shows the following:

$$Rb2(I_{QP3}) = RG2B(I_{QP1}) \quad (6)$$

Substituting again for $I_{QP1}$ using equation (2), the following results:

$$Rb2(I_{QP3}) = RG2B(A_{QP1}/A_{QP3})I_{QP3} \quad (7)$$

or $$Rb2 = (A_{QP1}/A_{QP3})RG2B \quad (8)$$

The relationship between resistors Rb1, Rb2, RG1B and RG2B as expressed by equations (5) and (8) ensures, given the previously described restraints, that the Bias node and input INP are at the same voltage. The negative feedback provided by resistor RG2A from the amplifier output OUT to the input INM forces input INM to be substantially equal in voltage to input INP. Assuming that RG2A is equal to RG2B and that RG1A is equal to RG1B, the amplifier output voltage $V_{OUT}$ for providing this level of feedback will be substantially equal to Vref. Thus, the two inputs INP and INM and the Bias node are at substantially equal voltages.

Table 1 below lists the various exemplary conditions which apply in the first operating mode.

TABLE 1

| First Operating Mode (Exemplary Conditions) | | |
|---|---|---|
| $V_{LO}, V_{HI} = +12$ V | Vdd = +3.3 V | Vref = +1.65 V |
| $A_{QP2,1} = 4A_{QP3}$ | $I_{QP1,2} = 2$ µA | $I_{QP3} = 500$ nA |
| RG1A, RG1B = 10 kΩ | Rb1 = 40 kΩ | RG2A, RG2B = 200 kΩ |
| Rb2 = 800 kΩ | $V_{INM}, V_{INP}, V_{BIAS}$ = +11.5 V | $V_{OUT}$ = +1.65 V |

As shown in Table 1, for a relatively high common mode voltage ($V_{LO}, V_{HI}$) of +12 V and for the exemplary values of the external resistors RG1A, RG2A, RG1B, Rb1 and Rb2 along with other various conditions listed, the amplifier input voltages $V_{INM}$ and $V_{INP}$ are +11.5 V (along with $V_{BIAS}$). Thus, the common mode voltage at the amplifier 28 inputs is substantially larger than the amplifier supply voltage Vdd of +3 V illustrating that, among other things, the function of the external resistors is not level shifting as is the case of the prior art circuit of FIG. 3. Since Vref in this example is set to Vdd/2, the output $V_{OUT}$ for a differential input voltage of 0 V is at Vdd/2 or +1.65 V. Thus, this amplifier configuration is capable of responding to current flow Ishunt through resistor Rs (FIG. 4) in either direction. If such bipolar sensing is not needed, Vref can be set to Gnd for positive mono-direction current or to Vdd for negative mono-direction current. Note also that in order to reduce power consumption, the areas $A_{QP1}$ and $A_{QP2}$ of the input transistors are made four times larger than $A_{QP3}$, the area of the biasing circuit 30 transistor QP3. Thus, the current in the input transistors QP1, QP2 (2 µA) is four times that of the biasing transistor QP3 (500 nA).

Given that the active input transistor pair QP1 and QP2 is properly biased during the first mode of operation, the differential signal applied to the emitters of these input transistors results in differential currents flowing through load resistors R1A and R1B. This differential signal is feed to a folded cascode transistor pair QN4 and QN5 biased by voltage Vb2 and cascode transistor pair QP4 and QP5 biased by voltage Vb1 which form the signal path. The signal is then folded down towards transistors QN6 and QN11 creating the first stage high impedance node. The input stage gain is produced at the collectors of QP4 and QN6 and at the collectors of QP5 and QN11. This circuitry forms the output of the input stage.

In the second mode of operation, the common mode input voltage is below the ground Gnd level. In the present example, the common mode voltage is at −12V, with the supply voltage remaining at +3.3 V. Under these conditions, the input stage operates in manner which is complementary to that of the first mode of operation. The input transistors QN1 and QN2 are operating in the active regions as is bias transistor QN3. Diodes D3, D4 and D6 are forward biased. Transistors QP1, QP2 and QP3 are off and diodes D9, D10 and D12 are reversed biased. Diodes D7, D8 and D11 bring the bases of transistors QP1, QP2 and QP3 to approximately the input common mode voltage so as to protect the emitter-base junctions of those transistors.

Note that in the second operating mode, the emitters of the transistors connected to inputs INP and INM will go negative as will the collector of transistor QN3. In order to avoid the turn on of substrate diodes, the circuitry is implemented using the well known silicon on insulator (SOI) process where each device is isolated with respect to the substrate by a trench. In SOI processes, the breakdown voltage of the trench is usually much higher than the junction breakdown, so that the relative voltage of two adjacent tubs, with one biased at the supply voltage Vdd and the other pushed at negative common modes, by way of example. The exemplary process used to implement amplifier 28 provides a trench breakdown voltage of 30 V, a junction breakdown voltage of 15V for the bipolar transistors and a 5 V maximum for the rest of the active devices.

Figure 6:
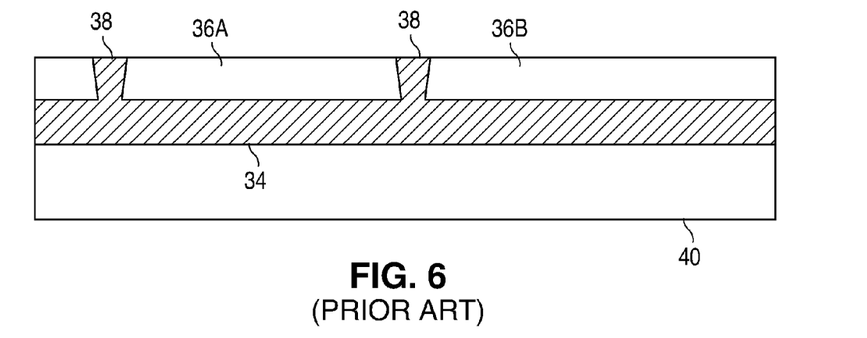
FIG. 6 shows a prior art wafer segment fabricated using a silicon-on-insulator (SOI) fabrication process.

FIG. 6 shows a SOI wafer segment such as would be formed using the VIP50CLZ3 5V SOI BiCMOS process from National Semiconductor Corp. The segment includes a buried insulating oxide layer 34 and vertical trenches 38, filled with insulating oxide, with the buried layer and vertical trenches defining several isolated regions such as regions 36A and 36B. Each transistor device of amplifier 28 is located in a separate one of these oxide isolation tubs.

The current amplifier 28 should be implemented so that the same external resistor values that provide proper biasing of the input transistors QP1 and QP2 in the first operating mode also provide proper biasing of input transistors QN1 and QN2 in the second operating mode. In addition, the quiescent currents $I_{QP1}$, $I_{QP2}$ should be equal to the quiescent currents of $I_{QN1}$, $I_{QN2}$ in the respective operating modes. In addition, as will be seen, currents $I_{QP3}$ and $I_{QN3}$ should be equal to one another in the respective operating modes.

Figure 7B:
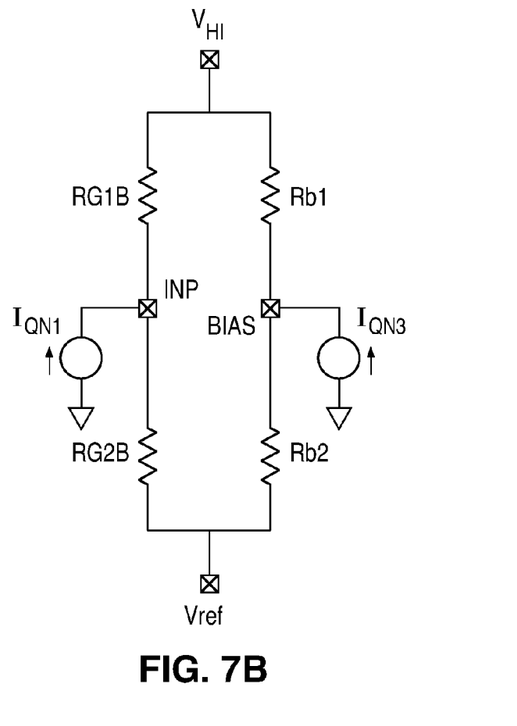

FIG. 7B is a diagram similar to FIG. 7A used to determine the input transistor biasing in the first mode of operation, but represents conditions for the second mode of operation. In the second mode, bias circuit 30 transistor QN3 sources current $I_{QN3}$ to the Bias node and to the external resistors Rb1/Rb2. In addition, input transistor QN1 sources current $I_{QN1}$ to the INP input node and to the external resistors RG1B/RG2B. An analysis of FIG. 7B similar to that carried out for FIG. 7A shows that the following relationships apply for the voltage at nodes INP and Bias to be equal:

$$Rb1 = (A_{QN1}/A_{QN3})RG1B \quad (9)$$

$$Rb2 = (A_{QN1}/A_{QN3})RG2B \quad (10)$$

Thus, assuming that the emitter areas $A_{QN1}$ and $A_{QN2}$ of the input transistors QN1 and QN2 are equal, and the ratio of emitter areas $A_{QN1}/A_{QN3}$ is the same as that for emitter areas $A_{QP1}/A_{QP3}$, the resistor values for Rb1, Rb2, RG1B, RG2B, RG2A and RG2B used in the first operating mode also function in the second operating mode to achieve proper biasing on transistors QN1, QN2 and QN3.

Table 2 below lists the various exemplary conditions as previously described which apply in the second operating mode.

TABLE 2

Second Operating Mode
(Exemplary Conditions)

| | | |
|---|---|---|
| $V_{LO}, V_{HI} = -12$ V | Vdd = +3.3 V | Vref = +1.65 V |
| $A_{QN2,1} = 4A_{QN3}$ | $I_{QN1,2} = 2$ μA | $I_{QN3} = 500$ nA |
| RG1A, RG1B = 10 kΩ | Rb1 = 40 kΩ | RG2A, RG2B = 200 kΩ |
| Rb2 = 800 kΩ | $V_{INM}, V_{INP}, V_{BIAS} = -11.5$ V | $V_{OUT} = +1.65$ V |

Once again, the input voltages $V_{INM}$, $V_{INP}$ and the Bias voltage $V_{BIAS}$ are equal to one another, with the voltage being −11.5 V when the common mode input voltage $V_{LO}$, $V_{HI}$ is −12V.

Referring again to the operation of the input stage of the current amplifier 28, in the third operating mode, the common mode voltage falls somewhere in a narrow range between the supply voltage Vdd and Gnd. In that case, both input transistor pair QN1,QN2 and QP1,QP2 are active. Folding transistors QN4 and QN5 allow this overlap between the region where NPN transistors QN1,QN2 are operative and where PNP transistors QP1,QP2 are operative. The transistors QN3 and QP3 both contribute to the currents at node INP and Bias so that the operating conditions are a blend of FIGS. 7A and 7B. Under these conditions, the voltages at nodes INM, INP and Bias are equal so that the desired proper bias in achieved.

As previously described, the common collectors of transistors QP4 and QN6 and the common collectors of transistors QN11 and QP5 form the differential output for the input stage section comprised of input transistors QN1/QN2 and the input stage section comprised of input transistors QP1/QP2. Transistors QN7, QN8, emitter degeneration resistors R4A and R4B and tail current source 12 of FIG. 5 constitute the second stage of the amplifier. This configuration forms a common emitter differential stage, with the base electrodes of transistors QN7 and QN8 forming the differential inputs, with the collectors of QN7 and QN8 providing a differential current output of the second stage. The second stage also controls the output common mode voltage of the input stage sections, setting that voltage to a value equal to the voltage drop across resistor R3A (or R3B) plus the base-emitter voltage of transistor QN6 (or QN11). The differential current outputs PFOLD1 and PFOLD2 of the second stage drive a conventional class-AB output stage shown in FIG. 8.

The input of the output stage includes a differential to single-ended converter made up of MOS transistors MP6-MP9, with transistors MP8 and MP9 being biased by voltage Vb3. The singled-ended output at the drain of MP9 is split into two components by transistors MP5 and MN5, including a first component for driving an upper output transistor MP1 and a second component for driving a lower output transistor MN1. The common drain connection of transistors MP1 and MN1 form the amplifier output Out. Transistor MP3 and related components function to bias transistor MP5 and transistor MN3 and related components function to bias transistor MN5 so that the output transistors MP1 and MB1 operate as a Class A-B output.

Thus, an exemplary embodiment of a current sense amplifier configuration has been disclosed. Although this embodiment has been described in some detail, it is understood that certain changes can be made by those skilled in the art without departing from the spirit and scope of the invention as defined by the appended claims.

What is claimed is:

1. An amplifier configuration comprising:
   a first amplifier input;
   a second amplifier input;
   a bias input, separate from the first and second amplifier inputs, to receive a common mode signal indicative of a common mode input voltage;
   a first amplifier input stage section having first and second inputs coupled to respective ones of the first and second amplifier inputs;
   a second amplifier input stage section having first and second inputs coupled to respective ones of the first and second amplifier inputs; and
   operating mode circuitry configured to switch the amplifier configuration between first and second operating modes in response to the common mode signal, where in the first operating mode the first amplifier input stage section is active and the second amplifier input stage section is inactive and where in the second operating mode the first amplifier input stage section is inactive and the second amplifier input stage section is active.

2. The amplifier configuration of claim 1 further including an impedance network which includes a first input impedance having a first terminal coupled to the first amplifier input and a second terminal to be coupled to a terminal of an input signal source, a second input impedance having a first terminal coupled to the second amplifier input and a second terminal to be coupled to another terminal of the input signal source and a first sensing impedance having a first terminal coupled to the bias input and a second terminal to be coupled to the input signal source.

3. The amplifier configuration of claim 2 wherein the first amplifier input is a non-inverting input and the second amplifier input is an inverting input and wherein the impedance network further includes a feedback impedance coupled between an amplifier output and the second amplifier input, a third impedance coupled between the first amplifier input and a reference voltage and a fourth impedance coupled between the bias input and a reference voltage.

4. The amplifier configuration of claim 1 wherein the first amplifier input stage section includes first and second bipolar transistors arranged in a common base configuration and the second amplifier input stage section includes third and fourth transistors arranged in a common base configuration and wherein emitters of the first and second bipolar transistors are coupled to the respective first and second amplifier inputs and wherein emitters of the third and fourth bipolar transistors are coupled to the respective first and second amplifier inputs.

5. The amplifier configuration of claim 4 wherein the operating mode circuitry is configured to provide a first bias voltage to common bases of the first and second bipolar transistors in the first operating mode and to provide a second bias voltage to common bases of the third and fourth bipolar transistors in the second operating mode.

6. The amplifier configuration of claim 5 wherein the first and second bipolar transistors are PNP type transistors coupled intermediate the first and second amplifier inputs and a lower supply rail and wherein the third and fourth bipolar transistors are NPN type transistors coupled intermediate the first and second amplifier inputs and an upper supply rail.

7. The amplifier configuration of claim 6 wherein the operating mode circuitry includes a first diode formed from the base and emitter regions of a diode-connected PNP type transistor, connected to the common bases of the first and second PNP type transistors and wherein the first diode conducts a first reference current when the amplifier configuration is in the first operating mode.

8. The amplifier configuration of claim 7 wherein the operating mode circuitry includes a second diode formed from the base-emitter region of a diode-connected NPN type transistor, connected to the common bases of the third and fourth NPN type transistors and wherein the second diode conducts a second reference current when the amplifier configuration is in the second operating mode.

9. The amplifier configuration of claim 8 wherein the first diode and the second diode are coupled to the bias input.

10. The amplifier configuration of claim 9 wherein during the first operating mode, the first diode is conductive and the second diode is non-conductive and the first reference current flows through the bias input and during the second operating mode the second diode is conductive and the first diode is non-conductive and second reference current flows though the bias input.

11. The amplifier configuration of claim 10 wherein the first amplifier input and the bias input are maintained as substantially equal voltages in the first and second operating modes when a selected resistor network is coupled to the first amplifier input and to the bias input.

12. The amplifier configuration of claim 1 wherein the operating mode circuitry is further configured to switch the amplifier configuration to a third operating mode in response to the common mode signal where both the first and second amplifier input stages are active.

13. An amplifier configuration configured to amplify a differential input signal having an associated common mode voltage, said amplifier configuration comprising:
a first amplifier input;
a second amplifier input;
a bias input, separate from the first and second amplifier inputs, to receive a common mode signal indicative of the common mode voltage;
a first amplifier input stage section having first and second inputs coupled to respective ones of the first and second amplifier inputs;
a second amplifier input stage section having first and second inputs coupled to respective ones of the first and second amplifier inputs; and
operating mode circuitry configured to switch the amplifier configuration between first and second operating modes in response to the common mode signal, where in the first operating mode the first amplifier input stage section is active and the second amplifier input stage section is inactive and where in the second operating mode the first amplifier input stage section is inactive and the second amplifier input stage section is active, with said common mode signal being produced when a first resistor is coupled between a source of the common mode voltage and the bias input and a second resistor is coupled between the bias input and a reference voltage.

14. The amplifier configuration of claim 13 wherein the operating mode circuitry is configured to bias the first amplifier input and the bias input at substantially a same voltage when the first resistor is coupled between a source of the common mode voltage and the bias input, the second resistor is coupled between the bias input and a reference voltage, a third resistor is coupled between a source of one component of the differential input signal and the first amplifier input and a fourth resistor is coupled between the first amplifier input and a reference voltage.

15. The amplifier configuration of claim 14 wherein the operating mode circuitry is configured to bias the first and second amplifier inputs and the bias input at substantially a same voltage when the first resistor is coupled between the source of the common mode voltage and the bias input, the second resistor is coupled between the bias input and a reference voltage, the third resistor is coupled between the source of one component of the differential input signal and the first amplifier input, the fourth resistor is coupled between the first amplifier input and a reference voltage, a fifth resistor is coupled between the second amplifier input and a source of another component of the differential input signal and a sixth resistor is coupled between an output of the amplifier configuration and the second amplifier input.

16. An amplifier configuration comprising:
a first amplifier input;
a second amplifier input;
a bias input, separate from the first and second amplifier inputs, to receive a common mode signal indicative of a common mode input voltage;
a first amplifier input stage section including first and second PNP type transistors having emitter terminals coupled to the respective first and second amplifier inputs;
a second amplifier input stage section including third and fourth NPN type transistor having emitter terminals coupled to the respective first and second amplifier inputs; and operating mode circuitry configured to switching the amplifier configuration between first and second operating modes in response to the common mode signal, where in the first operating mode a first bias voltage is applied to common base terminals of the first and second PNP type transistors, and in the second operating mode a second bias voltage, different from the first bias voltage, is applied to common base terminals of the third and fourth NPN type transistors.

17. The amplifier configuration of claim 16 further including a first resistance having a first terminal coupled to the bias input and a second terminal to be coupled to a common mode voltage source, a second resistance having a first terminal coupled to the first amplifier input and a second terminal to be coupled to a terminal of a signal source, and a third resistance having a first terminal coupled to the second amplifier input and a second terminal to be coupled to another terminal of the signal source.

18. The amplifier configuration of claim 17 further including a fourth resistance having a first terminal coupled to the second amplifier input and a second terminal coupled to an output of the amplifier configuration, a fifth resistance having a first terminal coupled to the first amplifier input and a second terminal to be coupled to a reference voltage and a sixth resistance having a first terminal coupled to the bias input and a second terminal to be coupled to a reference voltage.

* * * * *